(12) United States Patent
Gong

(10) Patent No.: US 11,165,048 B1
(45) Date of Patent: Nov. 2, 2021

(54) DISPLAY PANEL, METHOD OF MANUFACTURING SAME, AND DISPLAY DEVICE

(71) Applicant: Wuhan China Star Optoelectronics Semiconductor Display Technology Co., Ltd., Hubei (CN)

(72) Inventor: Wenliang Gong, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 287 days.

(21) Appl. No.: 16/604,268

(22) PCT Filed: Apr. 26, 2019

(86) PCT No.: PCT/CN2019/084521
§ 371 (c)(1),
(2) Date: Oct. 10, 2019

(87) PCT Pub. No.: WO2020/124922
PCT Pub. Date: Jun. 25, 2020

(30) Foreign Application Priority Data

Dec. 19, 2018 (CN) .......................... 201811566684.6

(51) Int. Cl.
*H01L 29/08* (2006.01)
*H01L 51/52* (2006.01)
*H01L 51/56* (2006.01)
*H01L 27/32* (2006.01)

(52) U.S. Cl.
CPC ........ *H01L 51/5281* (2013.01); *H01L 27/322* (2013.01); *H01L 51/56* (2013.01); *H01L 27/3244* (2013.01)

(58) Field of Classification Search
CPC .......................... H01L 51/5281; H01L 27/322
USPC .......................................................... 257/40
See application file for complete search history.

(56) References Cited

U.S. PATENT DOCUMENTS

| 8,487,320 | B2 * | 7/2013 | Zhu ......................... H01L 33/20 257/79 |
| 10,481,423 | B2 * | 11/2019 | Song ..................... H01L 51/524 |
| 10,989,936 | B2 * | 4/2021 | Kim ........................ G01S 17/04 |
| 11,024,775 | B2 * | 6/2021 | Tamma ................... H01L 33/10 |
| 2016/0161650 | A1 * | 6/2016 | Taraschi ............... G02B 26/023 349/70 |
| 2016/0370647 | A1 | 12/2016 | Chen |
| 2017/0192300 | A1 * | 7/2017 | Chung .................. H01L 27/326 |
| 2017/0338169 | A1 | 11/2017 | Mahler et al. |

FOREIGN PATENT DOCUMENTS

| CN | 104597656 A | 5/2015 |
| CN | 105511154 A | 4/2016 |

* cited by examiner

*Primary Examiner* — Caleb E Henry
(74) *Attorney, Agent, or Firm* — Taft Stettinius & Hollister LLP

(57) ABSTRACT

A display panel, a method of manufacturing the same and a display device are provided. Nano-array structures are produced on a surface of a black color resist unit of a color filter layer, so that a reflectance of the color filter layer is reduced because light is absorbed and diffuse-reflected through the nano-array structures, thereby increasing the contrast of the display panel.

20 Claims, 3 Drawing Sheets

DISPLAY PANEL, METHOD OF MANUFACTURING SAME, AND DISPLAY DEVICE

CROSS-REFERENCE TO RELATED APPLICATIONS

This application is a U.S. National Phase of International PCT Application No. PCT/CN2019/084521 filed Apr. 26, 2019, which claims the benefit of Chinese Patent Application Serial No. 201811566684.6 filed Dec. 19, 2018, the contents of each application are incorporated herein by reference in their entirety.

FIELD OF INVENTION

The present invention relates to a display field, and more particularly, to a display panel, a method of manufacturing the same, and a display device.

BACKGROUND OF INVENTION

A polarizer in a display panel can reduce the reflectivity of the display panel to ambient light under strong light, but it also has following defects. In one aspect, the polarizer reduces the lifetime of organic light emitting materials in the organic light emitting diode (OLED) display panel, in another aspect, the polarizer has a large thickness and uses brittle materials, which is not conducive to the development of the dynamic bending display panel. For developing dynamic bending display products based on the OLED display, new materials, new technologies, and new processes have to be introduced in place of polarizers.

In a display panel, the polarizer is replaced with a color filter layer to solve the above problems. The display panel using the color filter layer not only achieves thin and light display panels, but also improves the light output from 42% to 60% and the contrast of the display panel. However, the reflectance of the display panel using color filter layer and it is not conducive to outdoor display.

It is therefore necessary to have a display panel and a method of manufacturing the same to solve the above problems.

SUMMARY OF INVENTION

The present invention provides a display panel and a method of manufacturing the same, and a display device, in order to solve a problem that the display panel has high reflectivity to the ambient light.

To solve above problems, the present invention provides technical solutions as follows:

One embodiment of the present invention provides a display panel, comprising a substrate and a color filter layer disposed on the substrate;

wherein the display panel includes a pixel opening area and a non-opening area surrounding the pixel opening area, the color filter layer includes first color resist units corresponding to the pixel opening area and second color resist units corresponding to the non-opening area, each of the second color resist units includes a main body and nano-array structures disposed on a surface of the main body, and the nano-array structures are configured to reduce a light reflectance of the color filter layer.

In the display panel of the present invention, the first color resist units at least include a red color resist unit, a green color resist unit, and a blue color resist unit; and the second color resist units include a black color resist unit; and wherein two of the red color resist unit, the green color resist unit, and the blue color resist unit are separated by the black color resist unit.

In the display panel of the present invention, the nano-array structures are integrated with the main body.

In the display panel of the present invention, the nano-array structures include conical nano-array structures.

In the display panel of the present invention, the display panel further includes an organic light emitting layer and an encapsulation layer; and wherein the organic light emitting layer is disposed on the substrate, the encapsulation layer is disposed on the organic light emitting layer, and the color filter layer is disposed on the encapsulation layer.

In the display panel of the present invention, the display panel further includes a liquid crystal layer located between the substrate and the color filter layer; and wherein the color filter layer further includes a base, and the first color resist units and the second color resist units are disposed on a surface of the base.

In the display panel of the present invention, materials of the first color resist units and the second color resist units include photoresist.

One embodiment of the present invention provides a display device, comprising a display panel including a substrate and a color filter layer disposed on the substrate;

wherein the display panel includes a pixel opening area and a non-opening area surrounding the pixel opening area, the color filter layer includes first color resist units corresponding to the pixel opening area and second color resist units corresponding to the non-opening area, each of the second color resist units includes a main body and nano-array structures disposed on a surface of the main body, and the nano-array structures are configured to reduce a light reflectance of the color filter layer.

In the display device of the present invention, the first color resist units at least include a red color resist unit, a green color resist unit, and a blue color resist unit; and the second color resist units include a black color resist unit; and wherein two of the red color resist unit, the green color resist unit, and the blue color resist unit are separated by the black color resist unit.

In the display device of the present invention, the nano-array structures are integrated with the main body.

In the display device of the present invention, the nano-array structures include conical nano-array structures.

In the display device of the present invention, the display panel further includes an organic light emitting layer and an encapsulation layer; and wherein the organic light emitting layer is disposed on the substrate, the encapsulation layer is disposed on the organic light emitting layer, and the color filter layer is disposed on the encapsulation layer.

In the display device of the present invention, the display panel further includes a liquid crystal layer located between the substrate and the color filter layer; and wherein the color filter layer further includes a base, and the first color resist units and the second color resist units are disposed on a surface of the base.

In the display device of the present invention, materials of the first color resist units and the second color resist units include photoresist.

One embodiment of the present invention provides a method of manufacturing a display panel, wherein the display panel includes a pixel opening area and a non-opening area surrounding the pixel opening area, and the method of manufacturing the display panel comprises steps of:

provaling a substrate;

forming a color resist layer on the substrate, and a nano-array pattern on a surface of the color resist layer;

patterning the color resist layer having the nano-array pattern to form second color resist units corresponding to the non-opening area; and forming first color resist units corresponding to the pixel opening area between adjacent two of the second color resist units so as to form a color filter layer;

wherein each of the second color resist units includes a main body and nano-array structures disposed on a surface of the main body, and the nano-array structures are configured to reduce a light reflectance of the color filter layer.

In the method of the present invention, the step of forming the color resist layer on the substrate and the nano-array pattern on the surface of the color resist layer includes: providing a template having the nano-array pattern and transferring the nano-array pattern of the template to the color resist layer by a nano-imprint technology so as to form the nano-array pattern on the surface of the color resist layer.

In the method of the present invention, the step of patterning the color resist layer having the nano-array pattern to form second color resist units corresponding to the non-opening area includes: performing processes of exposing, etching, developing, and curing to the color resist layer having the nano-array pattern in order to pattern the color resist layer having the nano-array pattern.

In the method of the present invention, the method further comprises a step of: forming conical nano-array structures on the surface of the main body.

In the method of the present invention, the method further comprises a step of: forming an organic light emitting layer on the substrate, forming an encapsulation layer on the organic light emitting layer, and forming the color filter layer on the encapsulation layer.

In the method of the present invention, the method further comprises a step of: providing a base, forming the first color resist units and the second color resist units on a surface of the base.

The beneficial effects of the present invention are: the present invention provides a display panel, a method of manufacturing the same, and a display device having nano-array structures formed on a surface of a black color resist unit of a color filter layer, so that a reflectance of the color filter layer is reduced because light is absorbed and diffuse-reflected through the nano-array structures, thereby increasing the contrast of the display panel.

BRIEF DESCRIPTION OF DRAWINGS

In order to more clearly illustrate the technical solutions in the embodiment or in the present invention, the following drawings, which are intended to be used in the description of the embodiment or of the present invention, will be briefly described. It is understood that the drawings described below are merely some embodiments of the present invention, and it will be possible to those skilled in the art to obtain other drawings according to these drawings without creative efforts.

DETAILED DESCRIPTION OF PREFERRED EMBODIMENTS

Figure 1:
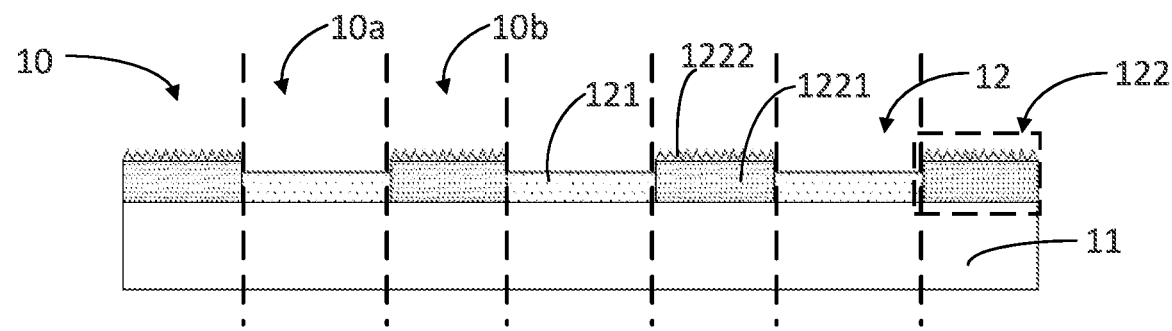
FIG. 1 is a schematic view of a display panel provided by one embodiment of the present invention.

The description of the following embodiments is used for exemplifying the specific embodiments of the present invention by referring to the accompany drawings. Furthermore, directional terms described by the present invention, such as upper, lower, front, back, left, right, inner, outer, side, etc., are only directions by referring to the accompanying drawings, and thus the directional terms are used to describe and understand the present invention, but the present invention is not limited thereto. In the drawings, like reference numerals designate like elements throughout the specification.

The present invention provides a display panel and a method of manufacturing the same in order to solve a problem that the display panel has high reflectivity to the ambient light.

Referring to FIG. 1, which is a schematic view of a display panel 10 provided by the first embodiment of the present invention.

According to one aspect of the present invention, a display panel 10 is provided with a substrate 11 and a color filter layer 12 disposed on the substrate 11.

In one embodiment, the substrate 11 comprises an array substrate. The array substrate includes a base and a thin film transistor array disposed on the base. The thin film transistor array is configured to control the display of pixels in the display panel 10.

It is characterized that the display panel 10 includes a pixel opening area 10a and a non-opening area 10b surrounding the pixel opening area 10a.

The display panel 10 includes a display area and a non-display area surrounding the display area. The display area is provided with pixels for realizing the display function of the display panel 10. There is a space between adjacent pixels.

It is characterized that the pixel opening area 10a corresponds to the pixels, and the non-opening area 10b corresponds to the space between the pixels.

In one embodiment, the color filter layer 12 includes first color resist units 121 corresponding to the pixel opening area 10a and second color resist units 122 corresponding to the non-opening area 10b.

The first color resist units 121 are configured to filter the light from the pixels and output light with a predetermined color; the second color resist units 122 are configured to absorb light between the pixels to prevent light leakage between adjacent pixels.

Each of the second color resist units 122 includes a main body 1221 and nano-array structures 1222 disposed on a surface of the main body 1221, and the nano-array structures 1222 are configured to reduce a light reflectance of the color filter layer. When the ambient light is incident on the display panel 10, diffuse-reflections occur at the nano-array structures 1222, thereby increasing light absorption and consumption. According to the present invention, the reflectance of the color filter layer 12 is reduced through the synergistic effect of diffuse-reflection and adsorption, thereby improving the contrast of the display panel 10.

In one embodiment, the nano-array structures 1222 are integrated with the main body 1221.

Each of the pixels at least includes a red sub-pixel, a green sub-pixel, and a blue sub-pixel.

In one embodiment, the first color resist units 121 at least include a red color resist unit, a green color resist unit, and a blue color resist unit; and the second color resist units 122 include a black color resist unit.

The red color resist unit corresponds to the red sub-pixel, the green color resist unit corresponds to the green sub-pixel, and the blue color resist unit corresponds to the blue sub-pixel.

It is characterized that two of the red color resist unit, the green color resist unit, and the blue color resist unit are separated by the black color resist unit so as to prevent light leakage between the adjacent pixels.

In one embodiment, materials of the first color resist units 121 and the second color resist units 122 include photoresist.

Nano-imprint technology (Nano Imprint Lithography, NIL) is a technique for transferring nano-microstructures on a template to a processing material by using a photoresist.

The NIL generally includes three steps as follows:
1. A template mechanic;
2. Transferring a pattern; and
3. Processing a base.

In one embodiment, the nano-array structures 1222 are formed on a surface of the main body 1221 by the nano-imprint technology, and thus the nano-microstructures of the nano-array structures 1222 can be realized by using the nano-imprint technology.

The nano-imprint technology breaks through the difficulty during the process of the reduced feature size in the traditional photoresist and has high resolution, low cost, and high yields.

The rough surface is prone to diffuse-reflection and appears dull. In the present invention, the roughness of the second color resist units 122 can be increased by the nano-array structures 1222.

In order to enhance the absorption and reflection of light, the nano-array structures 1222 are designated to be light-reflective shapes and structures. For example, the nano-array structures 1222 include conical nano-array structures.

Figure 4:
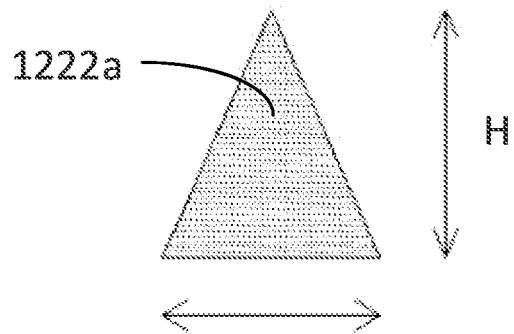
FIG. 4 is a schematic view of conical nano-array structures provided by one embodiment of the present invention.

Referring to FIG. 4, which is a schematic view of conical nano-array structures 1222a provided by the fourth embodiment of the present invention.

Conical nano-array structures 1222a are also called pyramid nano-array structures.

Figure 5:
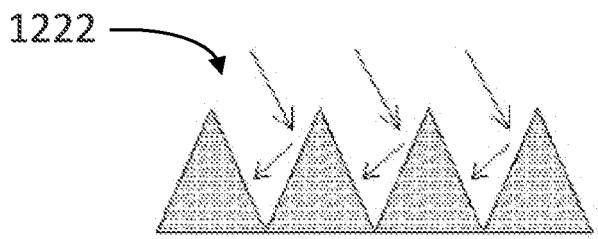
FIG. 5 is a schematic view showing that light is reflected by the nano-array structures provided by one embodiment of the present invention.

Referring to FIG. 5, which is a schematic view showing that light is reflected by the nano-array structures 1222a provided by the fifth embodiment of the present invention.

In one embodiment, the conical nano-array structures 1222a comprise conical nanostructures 1222a with an array arrangement. Each of the conical nanostructures 1222a can be simplified as an isosceles triangle from side view. A ratio coefficient $\rho$ can be obtained through calculating the ratio of height H to bottom area S of the isosceles triangle. When the value of $\rho$ is larger, the thinner the isosceles triangle and therefore the more number of reflections of light on the surface and the lower the reflectance. The smaller the value of $\rho$, the more difficult it is to prepare the nanostructures. Therefore, it is necessary to consider the technical cost and the technical effect to optimize the value of $\rho$.

In one embodiment, the shapes of the nano-array structures 1222 are not limited to conical shapes. The shape may also be a semicircular shape or the like that can increase the diffuse-reflection and absorption of light.

In one embodiment, the color filter layer 12 is applicable to one of a liquid crystal display panel and an organic light emitting display panel to enhance the aperture ratio of the display panel 10.

Figure 2:
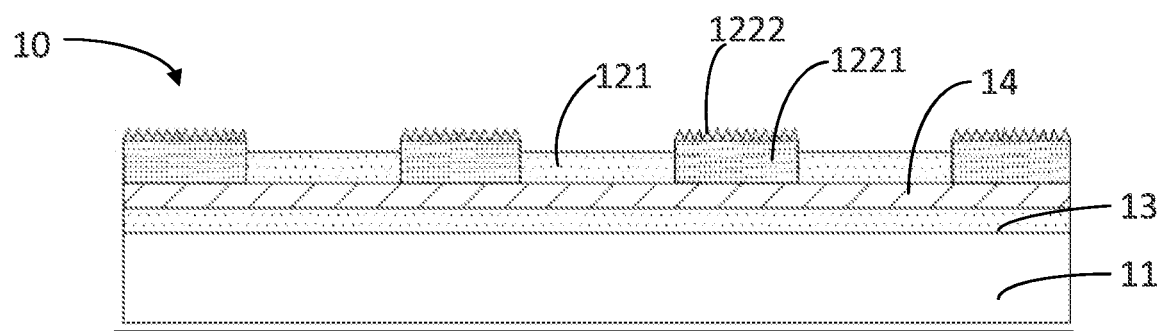
FIG. 2 is a schematic view of a display panel provided by another embodiment of the present invention.

Referring to FIG. 2, which is a schematic view of a display panel provided by the second embodiment of the present invention.

In one embodiment, the display panel 10 further includes an organic light emitting layer 13 and an encapsulation layer 14.

The organic light emitting layer 13 is disposed on the substrate 11, and the organic light emitting layer 13 includes an organic light emitting material.

The encapsulation layer 14 is disposed on the organic light emitting layer 13, and the encapsulation layer 14 is configured to protect the organic light emitting layer 13 from external water and oxygen.

The color filter layer 12 is disposed on the encapsulation layer 14, and the color filter layer 12 is configured to filter the light from the display panel 10.

Figure 3:
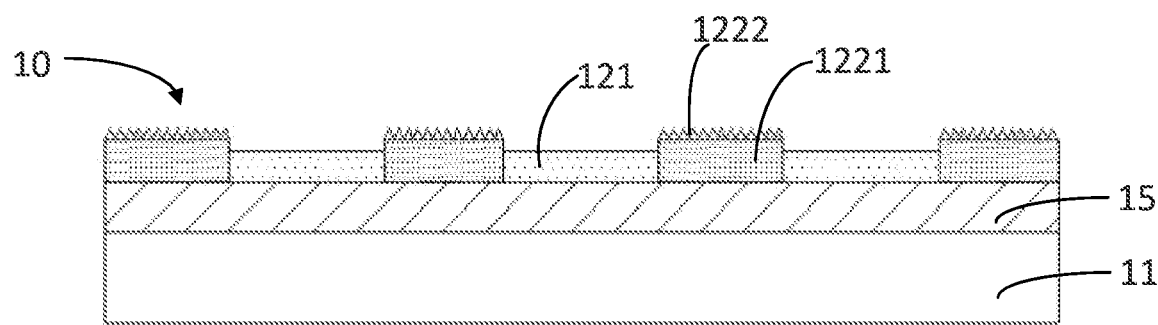
FIG. 3 is a schematic view of a display panel provided by a further embodiment of the present invention.

Referring to FIG. 3, which is a schematic view of a display panel provided by the third embodiment of the present invention.

In one embodiment, the display panel 10 further includes a liquid crystal layer 15 between the substrate 11 and the color filter layer 12.

The color filter layer 12 further includes a base. The first color resist units 121 and the second color resist units 122 are disposed on a surface of the base.

In one embodiment, the substrate 11 includes an array substrate. The array substrate and the color filter layer 12 are opposite to each other.

In one embodiment, the present invention provides a display device, comprising a display panel. The display panel includes a substrate and a color filter layer on the substrate.

It is characterized that the display panel includes a pixel opening area and a non-opening area surrounding the pixel opening area, the color filter layer includes first color resist units corresponding to the pixel opening area and second color resist units corresponding to the non-opening area, each of the second color resist units includes a main body and nano-array structures disposed on a surface of the main body, and the nano-array structures are configured to reduce a light reflectance of the color filter layer.

In one embodiment of the display device according to the present invention, the first color resist units at least include a red color resist unit, a green color resist unit, and a blue color resist unit; and the second color resist units include a black color resist unit.

It is characterized that two of the red color resist unit, the green color resist unit, and the blue color resist unit are separated by the black color resist unit.

In one embodiment of the display device according to the present invention, the nano-array structures are integrated with the main body.

In one embodiment of the display device according to the present invention, the nano-array structures include conical nano-array structures.

In one embodiment of the display device according to the present invention, the display panel further includes an organic light emitting layer and an encapsulation layer.

It is characterized that the organic light emitting layer is disposed on the substrate, the encapsulation layer is disposed on the organic light emitting layer, and the color filter layer is disposed on the encapsulation layer.

In one embodiment of the display device according to the present invention, the display panel further includes a liquid crystal layer located between the substrate and the color filter layer.

The color filter layer further includes a base, and the first color resist units and the second color resist units are disposed on a surface of the base.

In one embodiment of the display device according to the present invention, materials of the first color resist units and the second color resist units include photoresist.

Figure 6:
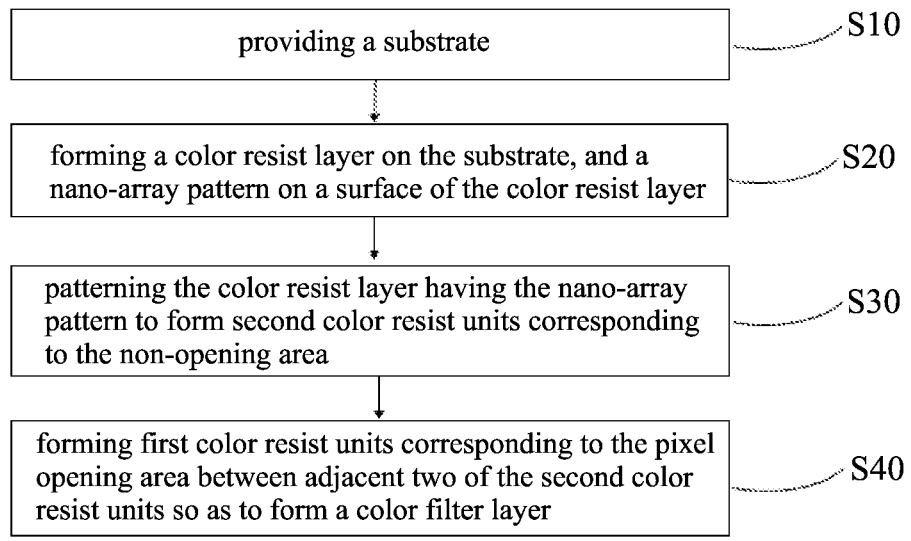
FIG. 6 is a schematic view showing a method of manufacturing a display panel provided by one embodiment of the present invention.

Referring to FIG. 6, which is a schematic view showing a method of manufacturing a display panel provided by the sixth embodiment of the present invention.

According to another aspect of the present invention, a method of manufacturing a display panel 10 is provided. The display panel 10 comprises a pixel opening area 10a and a non-opening area 10b surrounding the pixel opening area.

The display panel 10 includes a display area and a non-display area surrounding the display area. The display area is provided with pixels for realizing the display function of the display panel 10. There is a space between adjacent pixels.

It is characterized that the pixel opening area 10a corresponds to the pixels, and the non-opening area 10b corresponds to the space between the pixels.

Figure 7A:
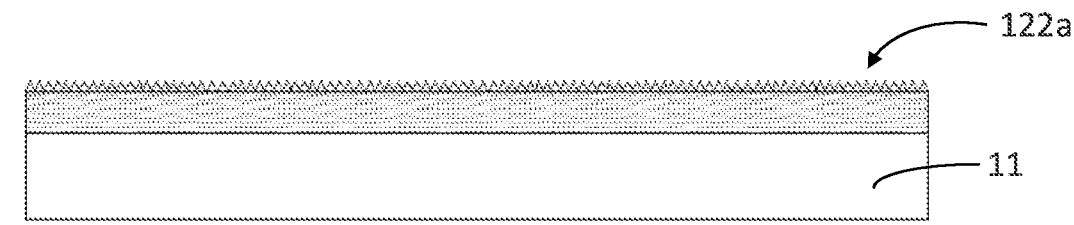
FIGS. 7a to 7c are flowchart of a method of manufacturing a display panel provided by one embodiment of the present invention.

The method of manufacturing the display panel 10 includes steps of:

Referring to FIG. 7a, step S10: providing a substrate 11;

step S20: forming a color resist layer on the substrate 11, and a nano-array pattern on a surface of the color resist layer.

In one embodiment, the step S20 specifically includes: providing a template having the nano-array pattern and transferring the nano-array pattern of the template to the color resist layer by a nano-imprint technology so as to form the nano-array pattern on the surface of the color resist layer.

In one embodiment, the template is a metallic template.

Figure 7B:
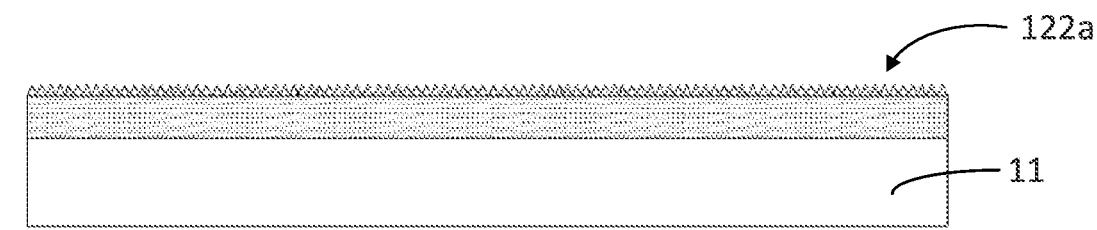

Referring to FIG. 7b, step S30: patterning the color resist layer having the nano-array pattern to form second color resist units 122 corresponding to the non-opening area 10b.

In one embodiment, the step S30 specifically includes: performing processes of exposing, etching, developing, and curing to the color resist layer having the nano-array pattern in order to pattern the color resist layer having the nano-array pattern.

Figure 7C:
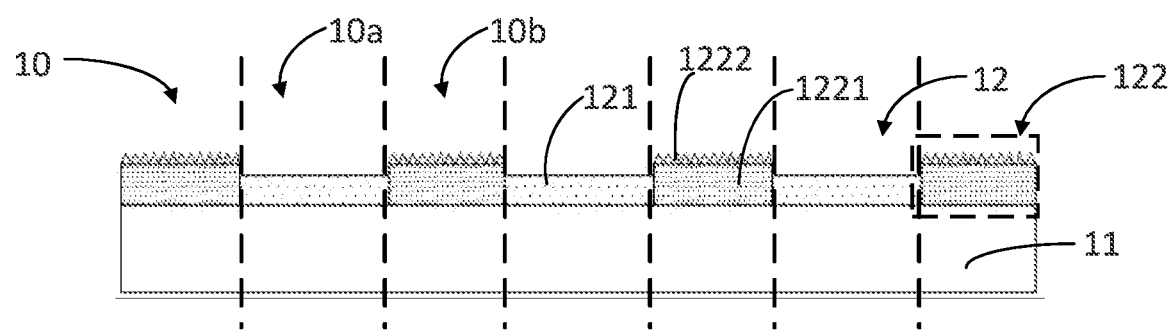

Referring to FIG. 7c, step S40: forming first color resist units 121 corresponding to the pixel opening area 10a between adjacent two of the second color resist units 122 so as to form a color filter layer 12.

It is characterized that each of the second color resist units 122 includes a main body 1221 and nano-array structures 1222 disposed on a surface of the main body 1221, and the nano-array structures 1222 are configured to reduce a light reflectance of the color filter layer.

The first color resist units 121 are configured to filter the light from the pixels and output light with a predetermined color; the second color resist units 122 are configured to absorb light between the pixels to prevent light leakage between adjacent pixels.

Each of the second color resist units 122 includes a main body 1221 and nano-array structures 1222 disposed on a surface of the main body 1221, and the nano-array structures 1222 are configured to reduce a light reflectance of the color filter layer. When the ambient light is incident on the display panel 10, diffuse-reflections occur at the nano-array structures 1222, thereby increasing light absorption and consumption. The reflectance of the color filter layer 12 is reduced through the synergistic effect of diffuse-reflection and adsorption, thereby improving the contrast of the display panel 10.

In one embodiment, the nano-array structures 1222 are integrated with the main body 1221.

In one embodiment, the method further comprises a step of: forming conical nano-array structures on the surface of the main body. In this embodiment, the nano-array structures 1222 include conical nano-array structures.

Each of the pixels at least includes a red sub-pixel, a green sub-pixel, and a blue sub-pixel.

In one embodiment, the first color resist units 121 at least include a red color resist unit, a green color resist unit, and a blue color resist unit; and the second color resist units 122 include a black color resist unit.

The red color resist unit corresponds to the red sub-pixel, the green color resist unit corresponds to the green sub-pixel, and the blue color resist unit corresponds to the blue sub-pixel.

It is characterized that two of the red color resist unit, the green color resist unit, and the blue color resist unit are separated by the black color resist unit so as to prevent light leakage between the adjacent pixels.

In one embodiment, materials of the first color resist units 121 and the second color resist units 122 include photoresist.

In one embodiment, the color filter layer 12 is applicable to one of a liquid crystal display panel and an organic light emitting display panel to enhance the aperture ratio of the display panel 10.

In one embodiment, the method further comprises a step of: forming an organic light emitting layer on the substrate, forming an encapsulation layer on the organic light emitting layer, and forming the color filter layer on the encapsulation layer corresponding to the preparation of the organic light emitting layer 13 and the encapsulation layer 14.

It is characterized that the organic light emitting layer 13 is disposed on the substrate 11, and the organic light emitting layer 13 includes an organic light emitting material.

The encapsulation layer 14 is disposed on the organic light emitting layer 13, and the encapsulation layer 14 is configured to protect the organic light emitting layer 13 from external water and oxygen.

The color filter layer 12 is disposed on the encapsulation layer 14, and the color filter layer 12 is configured to filter the light from the display panel 10.

In one embodiment, the method further comprises a step of: providing a base, forming the first color resist units and the second color resist units on a surface of the base.

In one embodiment, the display panel 10 further includes a liquid crystal layer 15 between the substrate 11 and the color filter layer 12.

The color filter layer 12 further includes a base. The first color resist units 121 and the second color resist units 122 are disposed on a surface of the base.

In one embodiment, the substrate 11 includes an array substrate. The array substrate and the color filter layer 12 are opposite to each other.

The beneficial effects are: the present invention provides a display panel, a method of manufacturing the same, and a display device having nano-array structures formed on a surface of a black color resist unit of a color filter layer, so that a reflectance of the color filter layer is reduced because light is absorbed and diffuse-reflected through the nano-array structures, thereby increasing the contrast of the display panel.

The present invention has been described with preferred embodiments thereof but the preferred embodiments are not intended to limit the present invention. It is understood that many changes and modifications to the described embodiments can be carried out by the skilled person in the art without departing from the scope and the spirit of the invention that is intended to be limited only by the appended claims.

What is claimed is:

1. A display panel, comprising a substrate and a color filter layer disposed on the substrate;
    wherein the display panel includes a pixel opening area and a non-opening area surrounding the pixel opening area, the color filter layer includes first color resist units corresponding to the pixel opening area and second color resist units corresponding to the non-opening area, each of the second color resist units includes a main body and nano-array structures disposed on a surface of the main body, and the nano-array structures are configured to reduce a light reflectance of the color filter layer.

2. The display panel according to claim 1, wherein the first color resist units at least include a red color resist unit, a green color resist unit, and a blue color resist unit; and the second color resist units include a black color resist unit; and
    wherein two of the red color resist unit, the green color resist unit, and the blue color resist unit are separated by the black color resist unit.

3. The display panel according to claim 1, wherein the nano-array structures are integrated with the main body.

4. The display panel according to claim 1, wherein the nano-array structures include conical nano-array structures.

5. The display panel according to claim 1, wherein the display panel further includes an organic light emitting layer and an encapsulation layer; and
    wherein the organic light emitting layer is disposed on the substrate, the encapsulation layer is disposed on the organic light emitting layer, and the color filter layer is disposed on the encapsulation layer.

6. The display panel according to claim 1, wherein the display panel further includes a liquid crystal layer located between the substrate and the color filter layer; and
    wherein the color filter layer further includes a base, and the first color resist units and the second color resist units are disposed on a surface of the base.

7. The display panel according to claim 1, wherein materials of the first color resist units and the second color resist units include photoresist.

8. A display device, comprising a display panel including a substrate and a color filter layer disposed on the substrate;
    wherein the display panel includes a pixel opening area and a non-opening area surrounding the pixel opening area, the color filter layer includes first color resist units corresponding to the pixel opening area and second color resist units corresponding to the non-opening area, each of the second color resist units includes a main body and nano-array structures disposed on a surface of the main body, and the nano-array structures are configured to reduce a light reflectance of the color filter layer.

9. The display device according to claim 8, wherein the first color resist units at least include a red color resist unit, a green color resist unit, and a blue color resist unit; and the second color resist units include a black color resist unit; and
    wherein two of the red color resist unit, the green color resist unit, and the blue color resist unit are separated by the black color resist unit.

10. The display device according to claim 8, wherein the nano-array structures are integrated with the main body.

11. The display device according to claim 8, wherein the nano-array structures include conical nano-array structures.

12. The display device according to claim 8, wherein the display panel further includes an organic light emitting layer and an encapsulation layer; and
    wherein the organic light emitting layer is disposed on the substrate, the encapsulation layer is disposed on the organic light emitting layer, and the color filter layer is disposed on the encapsulation layer.

13. The display device according to claim 8, wherein the display panel further includes a liquid crystal layer located between the substrate and the color filter layer; and
    wherein the color filter layer further includes a base, and the first color resist units and the second color resist units are disposed on a surface of the base.

14. The display device according to claim 8, wherein materials of the first color resist units and the second color resist units include photoresist.

15. A method of manufacturing a display panel, wherein the display panel includes a pixel opening area and a non-opening area surrounding the pixel opening area, and the method of manufacturing the display panel comprises steps of:
    providing a substrate;
    forming a color resist layer on the substrate, and a nano-array pattern on a surface of the color resist layer;
    patterning the color resist layer having the nano-array pattern to form second color resist units corresponding to the non-opening area; and
    forming first color resist units corresponding to the pixel opening area between adjacent two of the second color resist units so as to form a color filter layer;
    wherein each of the second color resist units includes a main body and nano-array structures disposed on a surface of the main body, and the nano-array structures are configured to reduce a light reflectance of the color filter layer.

16. The method according to claim 15, wherein the step of forming the color resist layer on the substrate and the nano-array pattern on the surface of the color resist layer includes:
    providing a template having the nano-array pattern and transferring the nano-array pattern of the template to the color resist layer by a nano-imprint technology so as to form the nano-array pattern on the surface of the color resist layer.

17. The method according to claim 15, wherein the step of patterning the color resist layer having the nano-array pattern to form second color resist units corresponding to the non-opening area includes:
    performing processes of exposing, etching, developing, and curing to the color resist layer having the nano-array pattern in order to pattern the color resist layer having the nano-array pattern.

18. The method according to claim 15, further comprising: forming conical nano-array structures on the surface of the main body.

19. The method according to claim 15, further comprising: forming an organic light emitting layer on the substrate, forming an encapsulation layer on the organic light emitting layer, and forming the color filter layer on the encapsulation layer.

20. The method according to claim 15, further comprising: providing a base, forming the first color resist units and the second color resist units on a surface of the base.

* * * * *